United States Patent
Maki et al.

(10) Patent No.: US 7,157,912 B2
(45) Date of Patent: Jan. 2, 2007

(54) APPARATUS FOR GENERATING HOMOGENEOUS MAGNETIC FIELD

(75) Inventors: Kohji Maki, Hitachi (JP); Tsuyoshi Wakuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/166,074

(22) Filed: Jun. 27, 2005

(65) Prior Publication Data

US 2005/0285597 A1    Dec. 29, 2005

(30) Foreign Application Priority Data

Jun. 28, 2004    (JP)    ............... 2004-189318

(51) Int. Cl.
*G01V 3/00*    (2006.01)
(52) U.S. Cl. ...................... 324/320; 324/318
(58) Field of Classification Search ................. 324/320
See application file for complete search history.

(56) References Cited

U.S. PATENT DOCUMENTS

| 3,510,832 A | | 5/1970 | Golay | |
| 3,622,869 A | * | 11/1971 | Golay | ......................... 324/320 |
| 5,530,355 A | * | 6/1996 | Doty | ........................... 324/318 |
| 2003/0197507 A1 | * | 10/2003 | Liu | ............................. 324/318 |

FOREIGN PATENT DOCUMENTS

| EP | 1 079 236 | | 2/2001 |
| EP | 1 361 454 | | 11/2003 |
| GB | 1135332 | * | 3/1966 |
| GB | 1135332 | | 12/1968 |

OTHER PUBLICATIONS

Romeo F and Hoult Di, "Magnet Field Profiling: Analysis and Correcting Coil Design", Magnetic Resonance in Medicine 1, p. 44-65 (1984).*
Romeo et al "Magnetic Field Profiling Analysis And Correcting Coil Design", Magentic Resonance In Medicine, Academic Press, Duluth, MN, US, vol. 1, No. 1, 1984, pp. 44-65.
F. Romeo and D.I. Hoult, "Magnet Field Profiling: Analysis and Correcting Coil Design", Magnetic Resonance in Medicine, 1, 44-65 (1984).

* cited by examiner

*Primary Examiner*—Diego Gutierrez
*Assistant Examiner*—Megann E Vaughn
(74) *Attorney, Agent, or Firm*—Antonelli, Terry, Stout and Kraus, LLP.

(57) ABSTRACT

At least one superconducting shim coil is wound around a cylinder member disposed approximately coaxially with a group of superconducting main coils, and the positions in the winding center locus in an axial direction change approximately in accordance with a function where a sine or cosine function with a cycle of (360/m) degrees (m; an integer of one or more) in a circumferential direction is mixed with a sine or cosine function with a cycle of (360/(m+2)) degrees.

8 Claims, 7 Drawing Sheets

APPARATUS FOR GENERATING HOMOGENEOUS MAGNETIC FIELD

CLAIM OF PRIORITY

This application claims priority from Japanese application Serial No. 2004-189318, filed on Jun. 28, 2004, the content of which is hereby incorporated by reference into this application.

DESCRIPTION OF THE INVENTION

1. Technical Field

The present invention relates to an apparatus for generating homogeneous magnetic field, and more particularly to an apparatus for generating homogeneous magnetic field for a nuclear magnetic resonance apparatus.

2. Related Art

In NMR apparatuses, it is necessary to generate a magnetic field having an extremely high homogeneity. However, it is impossible to achieve a desired homogeneous magnetic field only by superconducting main coils for generating the magnetic field because of distortion of magnetic field due to dimensional accuracy or installment accuracy of the coils. Thus, superconducting shim coils for correcting inhomogeneity of the magnetic field have been widely used.

Figure 10:
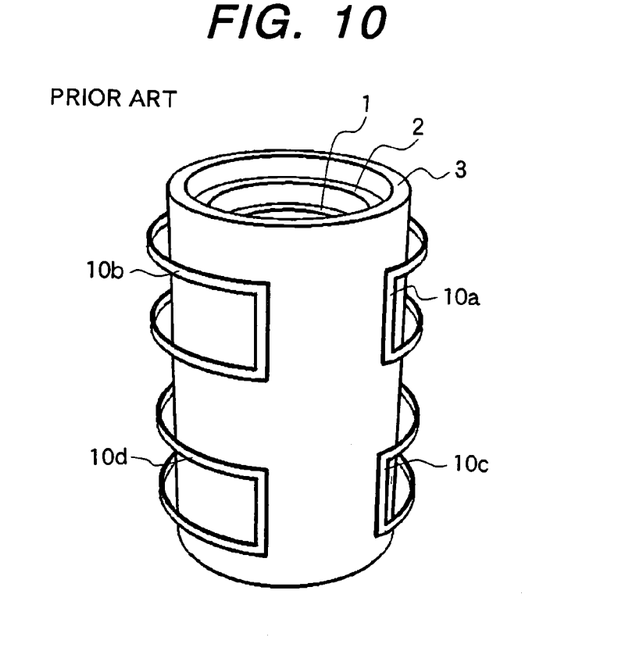
FIG. 10 is a perspective view of an example of a conventional apparatus for generating a homogeneous magnetic field.
Figure 11:
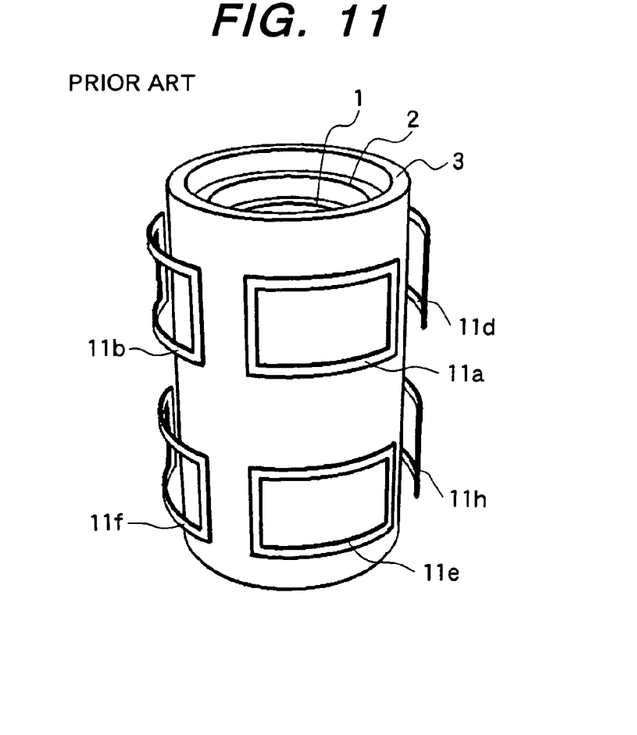
FIG. 11 is a perspective view of another example of a conventional apparatus for generating a homogeneous magnetic field.

The group of the superconducting shim coils is constituted by coils for correcting an axial symmetric inhomogeneous magnetic field and coils for correcting non-axial symmetric inhomogeneous magnetic field. As the coils for correcting the axial symmetric inhomogeneous magnetic field, solenoid coils are used in general. On the other hand, as coils for correcting non-axial symmetric inhomogeneous magnetic field, it is general that saddle type coils as shown in FIGS. 10 and 11 have been used (Refer to non-patent publication No. 1).

As for the coils for correcting non-axial symmetric inhomogeneous magnetic field, spiral type coils have been proposed (Refer to patent document No. 1), wherein the number of windings is changed in the axial direction approximately in accordance with a function of sine or a function of cosine. (Patent document No. 1) Japanese patent No. 2,593,435 (Non-patent document No. 1) F. Romeo and D. I. Hoult, "Magnet Field Profiling: Analysis and Correcting Coil Design", "Magnetic Resonance in Medicine, 1, 44–65 (1984)"

SUMMARY OF THE INVENTION

In the conventional art shown above, there are following problems: That is, when the superconducting shim coils are manufactured by the saddle type coils or spiral type coils, the shim coils are so disposed as to be sticked or adhered to a cylindrical face with a center axis of a winding bobbin for the superconducting main coils. Therefore, it is difficult to stably support the shim coils when the number of the windings increases. Accordingly, if a group of the superconducting shim coils are constituted by the saddle type coils or the spiral coils, capability of correction of the magnetic field may be insufficient.

A first example of insufficient correction capability of magnetic field is found in a case where lengths of the superconducting main coil group and the superconducting shim coil group in the axial direction are short so as to improve installment of the NMR apparatus. If the length of the superconducting main coils in the axial direction is made short, inhomogeneity increases in general. As a result, requirement for the superconducting shim coils becomes severe. On the other hand, if the length of the shim coil group is made short, it is impossible to distribute desired current in such a position that the magnetic field is effectively generated. As a result, ability of correcting magnetic field decreases. If these phenomena are superposed, the ability of correcting the magnetic field by the superconducting shim coils becomes insufficient.

A second example of insufficient correction capability of magnetic field is found in a case where the superconducting main coils are divided in an axial direction (hereinafter referred to as a split type) to form a gap therebetween so as to put a sample tube through the gap and to utilize a high sensitive solenoid type detection antenna. In this case, non-axial inhomogeneous magnetic field is large due to structural asymmetry. As a result, the ability of magnetic field correction by the superconducting shim coils becomes insufficient.

An object of the present invention is to provide an apparatus for generating a homogeneous magnetic field, which has a group of superconducting shim coils with high capability of correction of the non-axial symmetric inhomogeneous magnetic field. As for a coil for correcting the axial symmetric inhomogeneous magnetic field, solenoid coils are utilized as the same as in the conventional technology. Accordingly, this point will not be described in the following.

The present invention provides an apparatus for generating a homogeneous magnetic field, which has a group of superconducting main coils for generating a magnetic field in a measuring space and a group of superconducting shim coils for correcting inhomogeneity of the magnetic field, wherein at least one of the shim coils is wound around a cylinder member disposed in a coaxial relation with the group of the superconducting main coils, and wherein the at least two of the superconducting shim coils are wound in such a manner that the shim coils diagonally cross over in the outer surface of the cylinder member and a plurality of turns of wound superconducting shim coils diagonally transverses the face of the cylinder member.

EXPLANATION OF THE REFERENCE NUMERALS

1–3; group of superconducting main coils, 1a–3a; group of superconducting main coils, 1b–3d; group of superconducting main coils, 4a–4d; superconducting shim coils, 5a–8d; superconducting shim coils, 6a–6d; superconducting shim coils, 7a–7d; superconducting shim coils, 8a–8d; superconducting shim coils, 10a–10d; saddle type superconducting shim coils, 11a–11h; saddle type superconducting shim coils, 15; winding bobbin, 20; measuring space. (Means for achieving the object)

DETAILED DESCRIPTION OF THE PREFERRED EMBODIMENTS

The apparatus for generating a homogeneous magnetic field according to the present invention comprises a group of superconducting main coils for generating a magnetic field in a measuring space and a group of superconducting shim coils for correcting inhomogeneity of the magnetic field, wherein at least one shim coil is wound around a cylinder member or the like, which is disposed coaxially with the group of the superconducting main coils.

The at least one of the superconducting shim coils is wound in such a manner that positions of a winding center locus in an axial direction of the superconducting shim coil change approximately in accordance with a combination of a sine or cosine function with a cycle of (360/m) degrees (m: an integer of one or more) in a circumferential angle and a sine or cosine function with a cycle of (360/(m+2) degrees). By this structure, the number of windings of the superconducting shim coils can be made larger than that of the conventional saddle type coils. At the same time, it is possible to suppress generation of modes of a magnetic field, which is not appreciated and is normally increased when the number of winding is increased.

The apparatus for generating a homogeneous magnetic field according to the present invention comprises a group of superconducting main coils for generating a magnetic field in a measuring space and a group of superconducting shim coils for correcting inhomogeneity of the magnetic field, wherein at least two superconducting shim coils are wound around a cylinder member or the like disposed coaxially with the group of the main coils, and wherein the at least two of superconducting shim coils are wound in such a manner that positions of a winding center locus in the axial direction of the shim coil change approximately in accordance with a combination of a sine or cosine function with a cycle of (360/m) degrees and a sine or cosine function with a cycle of (360/(m+2)) degrees, a difference between the maximum value and the minimum value of the respective combined functions being different from each other.

The apparatus for generating a homogeneous magnetic field according to the present invention comprises a group of superconducting main coils for generating a magnetic field in a measuring space and a group of superconducting shim coils for correcting inhomogeneity of the magnetic field, wherein the at least two superconducting shim coils are wound around a cylinder member or the like disposed coaxially with the group of the superconducting main coils, and wherein positions of the winding center locus in an axial direction change approximately in accordance with a sine or cosine function with a cycle of (360/m) degrees (m: an integer of one or more) mixed with a sine or cosine function with a cycle of (360/(m+2)) degrees, differences between the maximum values and the minimum values being different from each other.

The apparatus for generating a homogeneous magnetic field according to the present invention comprising a group of superconducting main coils and a group of superconducting shim coils for correcting inhomogeneity of the magnetic field, wherein at least two of the superconducting shim coils are wound around a cylinder member or the like coaxially aligned with the superconducting main coils, and wherein positions in the axial direction in a locus of the center of the windings change approximately in accordance with sine or cosine function with a cycle of (360/m) degrees (m: an integer of one or more), a difference between the minimum values and the maximum values of the function being different from each other.

The apparatus for generating a homogeneous magnetic field according to the present invention comprising a group of superconducting main coils and a group of superconducting shim coils for correcting inhomogeneity of the magnetic field, wherein the at least two superconducting shim coils are wound around a cylinder coaxially aligned with the superconducting main cols, and wherein positions of the winding center locus in the axial direction change approximately in accordance with sine or cosine function with a cycle of (360/m) degrees (m: an integer of one or more), a distance of the superconducting shim coils from the center axis being different from each other.

In the apparatus for generating a homogeneous magnetic field according to the present invention, the at least one of shim coils is located at a position sandwiched between the superconducting main coils and the measuring space in the radial direction.

In the homogeneous magnetic field generating apparatus according to the present invention, the at least one of shim coils generates magnetic field components having plural modes simultaneously.

In the apparatus for generating a homogeneous magnetic field according to the present invention, values of current flowing through the superconducting shim coils are controlled independently, thereby to correct the magnetic field components of plural modes.

In the apparatus for generating a homogeneous magnetic field according to the present invention, the group of the superconducting main coils is composed of a first group of superconducting main coils and a second group of superconducting main coils.

According to the present invention, it is possible to obtain an apparatus for generating a homogeneous magnetic field having superconducting shim coils with a high capability of correcting non-axial symmetric inhomogeneous magnetic field.

In the following, embodiments of the present invention will be explained by reference to drawings; the scope of the present invention is not limited to the embodiments, however.

Embodiment 1

Figure 1:
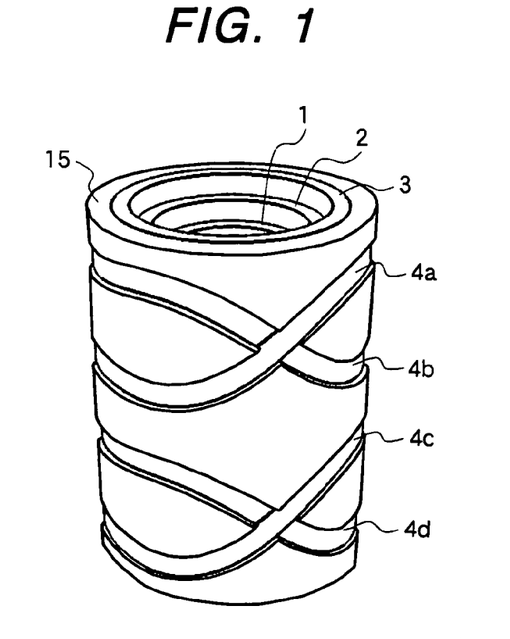
FIG. 1 is a perspective view of an apparatus for generating a homogeneous magnetic field of a first embodiment of the present invention.

FIG. 1 is a perspective view of one embodiment of the homogeneous magnetic field generating apparatus of the present invention. The superconducting shim coils 4a–4d are wound around a cylinder bobbin 15 disposed approximately coaxially with the group of superconducting main coils 1–3; positions of the winding center of locus in an axial direction of the windings change approximately in accordance with a combination of a sine function with a cycle of 360 degrees (i.e. 360/m degrees; m=1) and a sine function with a cycle of 360/3=120 degrees in a circumferential direction.

The positions of the superconducting shim coils 4a, 4b in the axial direction follow the functions, which differ by a phase angle of π. Similarly, the superconducting shim coils 4c and 4d follow the functions. The superconducting shim coils constitute the group of superconducting shim coils with superconducting shim coils (not shown).

In the homogeneous magnetic field generating apparatus according to the present invention, there is no difficulty in assembling even when the number of the windings is increased more than that of the superconducting shim coils of the apparatuses shown in FIGS. 10 and 11. However, when the number of the windings is large, the structure of the coil differs from an optimum structure obtained by a mathematic method more and more. As a result, undesired modes of magnetic field are generated accordingly. In the case of a shim coil of m=1, the generation of the magnetic field corresponding to m=3 is the most problematic.

The reason of mixing a sine function with a cycle of (360/3) degrees with a sine function with a cycle of 360 degrees is to reduce the magnetic field of undesired modes to the acceptable level.

When the homogeneous magnetic field generating apparatus is applied to an NMR apparatus, a probe having a detection antenna is inserted along the center axis of the group of the superconducting main coils. A sample tube containing a sample is inserted along the center axis of the superconducting main coils to dispose it in a sensing area. The probe is inserted from the bottom, and the sample tube is inserted from the top, respectively, in general. The present invention is not limited to the above.

In the conventional apparatuses shown in FIGS. 10 and 11, 10a–10d denote superconducting shim coils of a saddle type (m=1) and 11a–11h denote superconducting shim coils of a saddle type (m=2).

Embodiment 2

Figure 2:
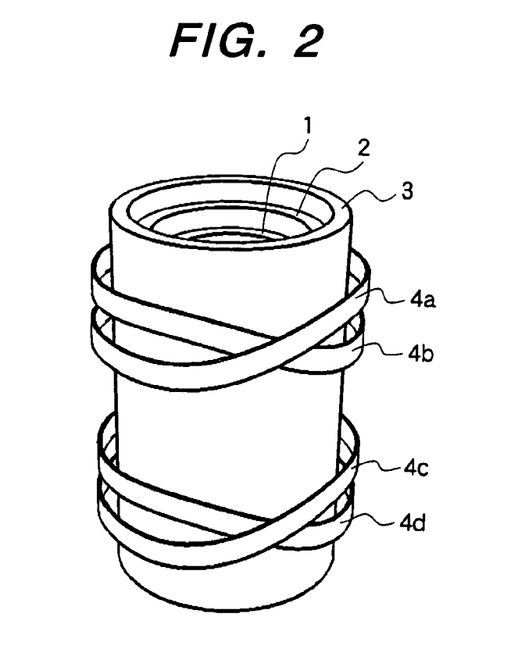
FIG. 2 is a perspective view of an apparatus for generating a homogeneous magnetic field of a second embodiment of the present invention.

FIG. 2 is a perspective view of a homogeneous magnetic field generating apparatus of another embodiment of the present invention. In this embodiment, though its fundamental structure is the same as that of embodiment 1, the difference between the maximum values and the minimum values of the function (the combination of a sine function with a cycle of 360 degrees and a sine function with a cycle of 120 degrees cycle) is small. Bobbins for supporting each of the coils are not shown. The present invention is effective when there is a limitation of the axial length of the coils.

Embodiment 3

Figure 3:
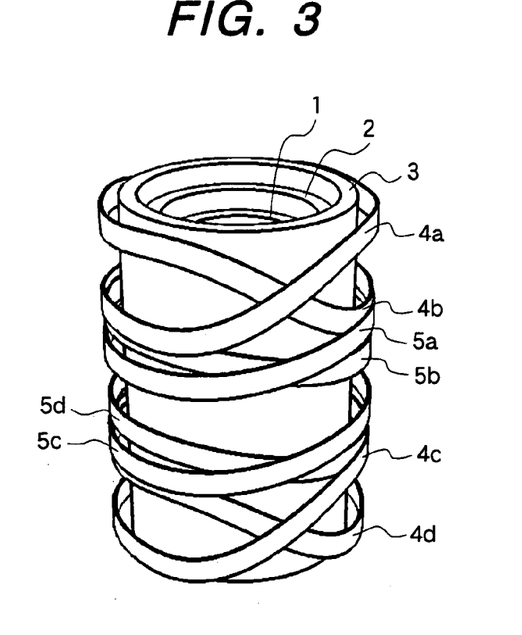
FIG. 3 is a perspective view of an apparatus for generating a homogeneous magnetic field of a third embodiment of the present invention.
Figure 4:
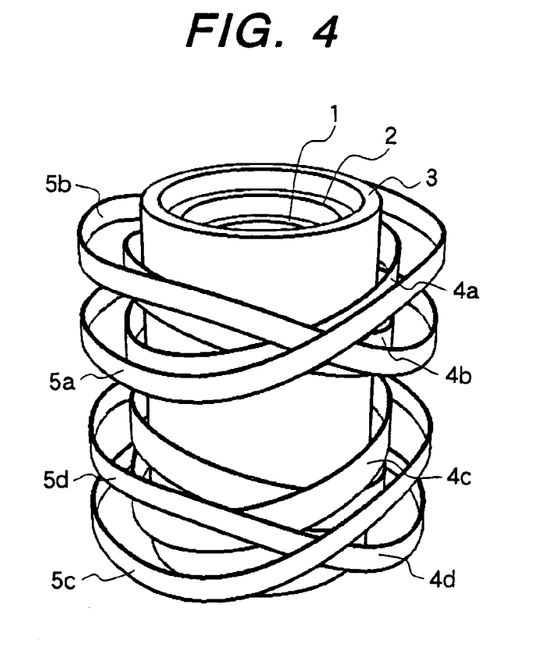
FIG. 4 is a perspective view of an apparatus for generating a homogeneous magnetic field of a modified embodiment of the third embodiment of the present invention.

FIG. 3 shows a perspective view of a still another embodiment of the present invention. Bobbins for supporting the respective shim coils are not shown. In this embodiment, the first group of superconducting shim coils 4a–4d and the second group of superconducting shim coils 5a–5d are wound on an approximate cylinder (winding bobbin) disposed coaxially. The first group of superconducting shim coils and the second group of superconducting shim coils differ in the differences between the maximum values and the minimum values of the functions, which change approximately in accordance with axial positions of the locus of the winding center. The radius of the cylinder face around which the first and second superconducting shim coils 4a–4d and 5a–5d are wound may be greatly different as shown in FIG. 4.

The first superconducting shim coils and the second superconducting shim coils constitute a group of superconducting shim coils together with superconducting shim coils (not shown). If at least one shim coil is constituted to generate magnetic components of plural modes and if values of current flowing through the superconducting shim coils are independently controlled, magnetic components of plural modes are corrected simultaneously.

Embodiment 4

Figure 5:
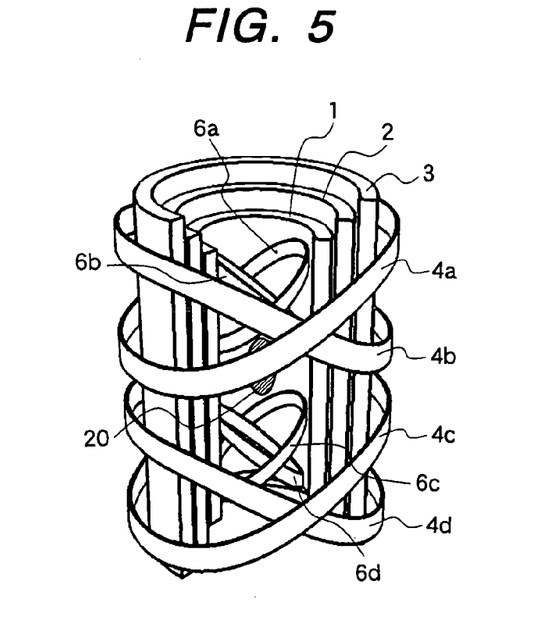
FIG. 5 is a perspective view of an apparatus for generating a homogeneous magnetic field of a fourth embodiment of the present invention.

FIG. 5 is a perspective view of another embodiment of the apparatus for generating a homogeneous magnetic field of the present invention.

Bobbins for supporting the shim coils are not shown. In this embodiment, a first group of superconducting shim coils 4a–4d are disposed radially outside of the group of the superconducting main coils 1–3 and a second group of superconducting shim coils 6a–6d are disposed radially inside of the superconducting main coils at a position surrounding the measuring space 20. A sample tube, not shown, is inserted through the measuring space 20. The superconducting shim coils constitute a group of superconducting shim coils together with superconducting shim coils not shown.

Figure 6:
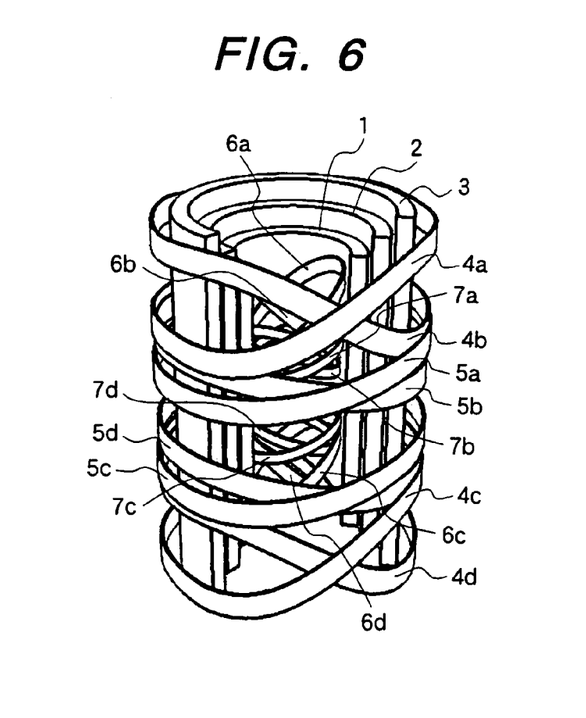
FIG. 6 is a perspective view of an apparatus for generating a homogeneous magnetic field of a modified embodiment of the fourth embodiment of the present invention.

Further, as shown in FIG. 6, there may be disposed the first group of superconducting shim coils 4a–4d and the second group of superconducting shim coils 5a–5d radially outside of the superconducting main coils 1–3 and the third group of superconducting shim coils 6a–6d and a fourth group of superconducting shim coils 7a–7d radially inside of the superconducting main coils at positions surrounding the measuring space (although not shown in FIG. 6, it is the same as in FIG. 5). In FIGS. 5 and 6, a part of the main coils is broken away so as to see the inside of the magnet.

Embodiment 5

Figure 7:
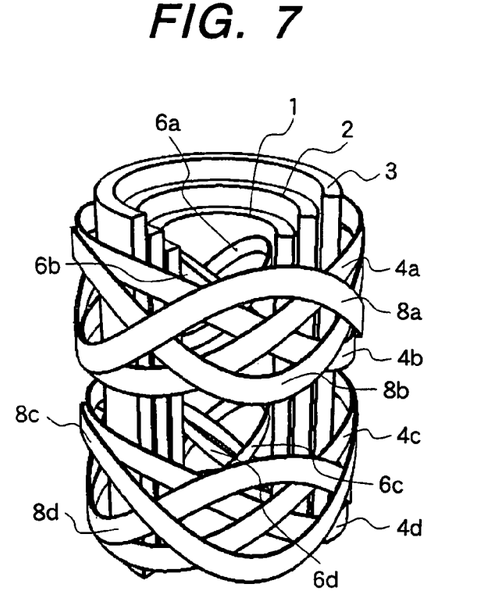
FIG. 7 is a perspective view of an apparatus for generating a homogeneous magnetic field of a fifth embodiment of the present invention.

FIG. 7 is a perspective view of another embodiment of the homogeneous magnetic field generating apparatus of the present invention. A bobbin for supporting each of the coils is not shown. In this embodiment, the apparatus comprises, in addition to the superconducting main coils 1–3, superconducting shim coils 4a–4d, 6a–6d that follow approximately a sine function with a cycle of 360 degrees (i.e. 360/m degrees; m=1) and superconducting shim coils 8a–8d that follow approximately a sine function with a cycle of 180 degrees (i.e. (360/m degrees; m=2). The superconducting shim coils constitute a group of superconducting shim coils together with superconducting shim coils (not shown).

Figure 8:
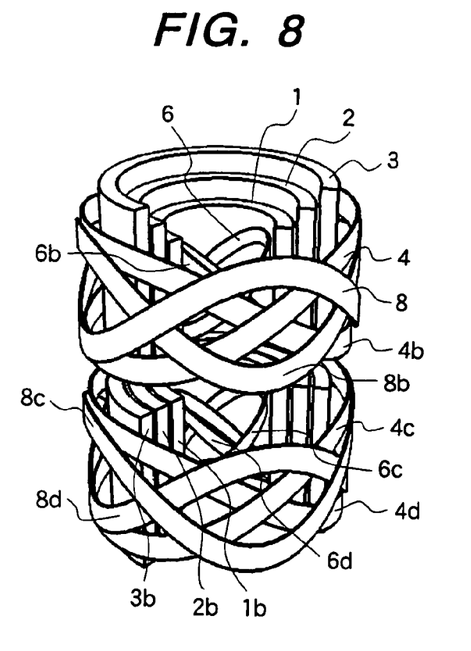
FIG. 8 is a perspective view of an apparatus for generating a homogeneous magnetic field of a modified embodiment of the fifth embodiment of the present invention.
Figure 9:
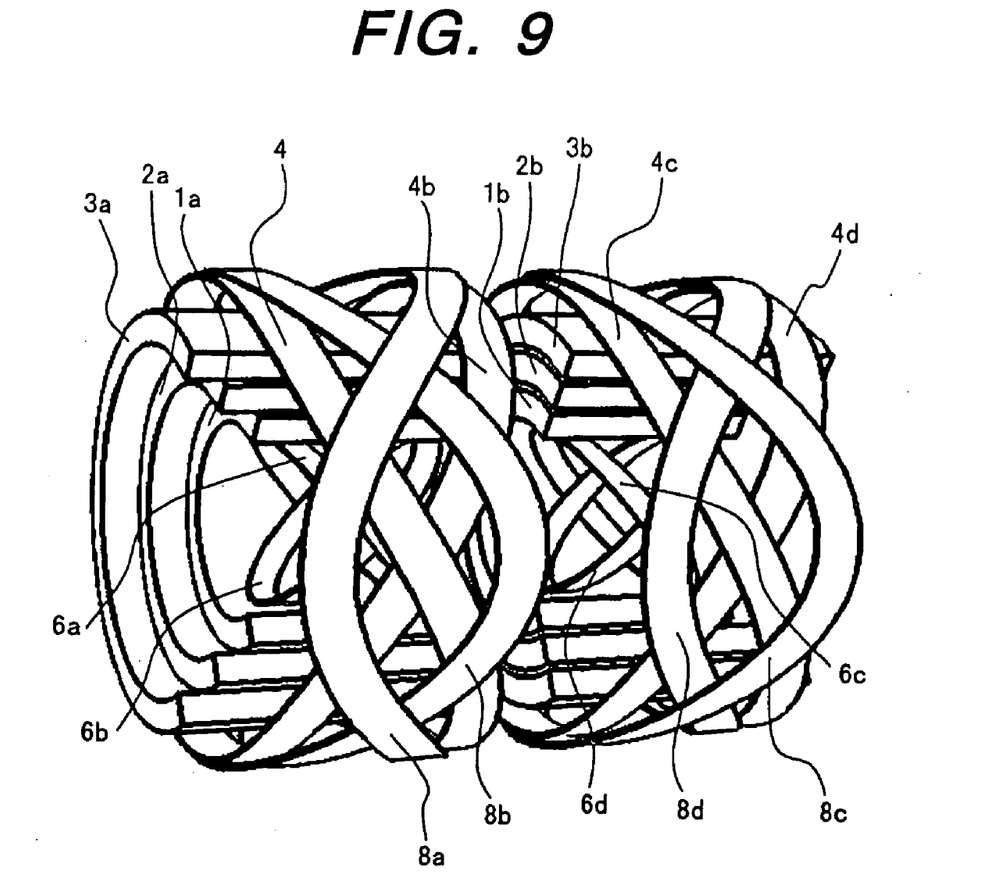
FIG. 9 is a perspective view of an apparatus for generating a homogeneous magnetic field of another modified embodiment of the fifth embodiment of the present invention.

In this embodiment, as shown in FIG. 8, the superconducting main coils may be so-called a split type, wherein the group of the main coils is divided into a first group of superconducting main coils 1a–3a and a second group of superconducting main coils 1b–3b. Further, as shown in FIG. 9, the split type superconducting magnetic field generating apparatus may be used as a lateral type or a horizontal type. In FIGS. 7–9, a part of the superconducting main coils is broken away to see inside the coils.

When the homogeneous magnetic field generating apparatus of the split type superconducting main coils is applied to an NMR apparatus, the probe having the detection antenna for detecting NMR signals may be inserted along the center axis of the main coils or inserted through a gap between the first group of the superconducting main coils and the second group of the superconducting main coils. The sample tube containing the sample is the same as the probe.

As having been explained above, according to the present invention, it is possible to provide an apparatus for generating a homogeneous magnetic field with a group of superconducting shim coils having a high capability of correcting non-axial symmetric inhomogeneous magnetic field. When the apparatus is applied to NMR apparatuses, it is possible to realize a small sized NMR apparatus or a small sized split type NMR apparatus.

Figure 12:
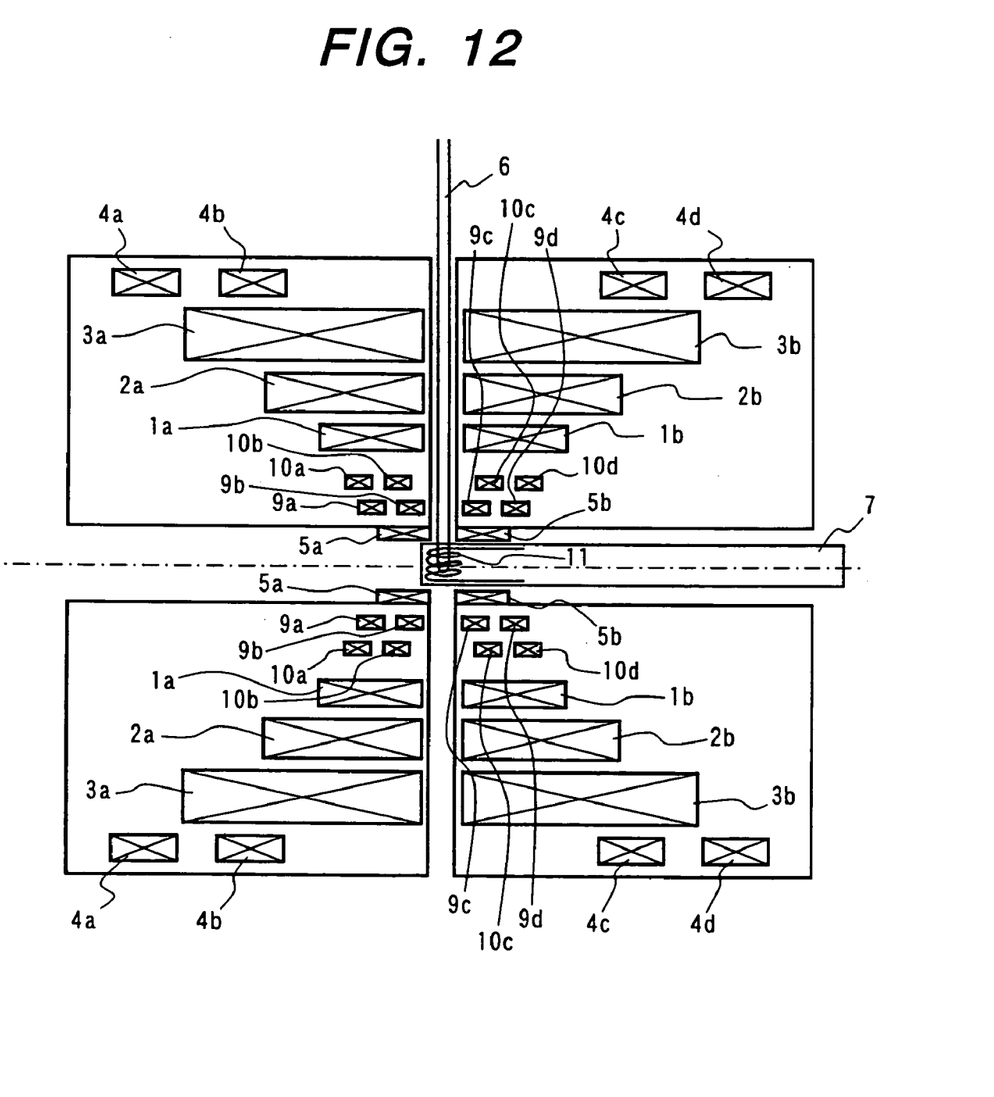
FIG. 12 is a cross sectional view of a main part of a split type NMR apparatus of an embodiment of the present invention.

FIG. 12 shows a cross sectional view of a split type superconducting magnet for NMR. In FIG. 12, cylindrical bobbins for the shim coils are not shown. 1a to 3a and 1b to 3b denote superconducting main coils, which form a measuring space. 4a to 4d, 9a to 9d, 10a to 10d denote superconducting shim coils; 5a and 5b denote room temperature shim coils; 6 is a sample tube; 7 denotes a probe having a solenoid antenna 11.

Since at least two of the superconducting shim coils are wound around a cylinder member in such a manner that the shim coils diagonally cross over in the outer surface of the cylinder member and a plurality of turns of wound superconducting shim coils diagonally transverses the face of the cylinder member, it is possible to increase the number of turns of the shim coils. As a result, a more effective correction of the inhomogeneity of the magnetic field is expected. Further, since the winding of the shim coils transverse the surface of the cylinder member, this structure improves fitting of the shim coils to the cylinder member.

What is claimed is:

1. A homogeneous magnetic field generating apparatus having a group of superconducting main coils for generating a magnetic field in a measuring space and a group of superconducting shim coils for correcting inhomogeneity of the magnetic field, wherein at least one of the shim coils is wound around a cylinder member or the like disposed in a coaxial relation with the group of the superconducting main coils, and wherein the at least one of the superconducting shim coils is wound in such a manner that positions of a winding center locus in an axial direction of the superconducting shim coil change approximately in accordance with a combination of a sine or cosine function with a cycle of (360/m) degrees (m: an integer of one or more) in a circumferential direction and a sine or cosine function with cycle of (360/(m+2)) degrees.

2. The homogeneous magnetic field generating apparatus according to claim 1, wherein at least two of the superconducting shim coils are wound around the cylinder member or the like disposed coaxially with the group of the main coils, and wherein the at least one of the superconducting shim coils is wound in such a manner that positions of a winding center locus of the shim coil change approximately in accordance with a combination of a sine or cosine function with a cycle of (360/m) degrees (m: an integer of one or more) in a circumferential direction and a sine or cosine function with a cycle of (360/(m+2)) degrees, differences between the maximum values and the minimum values of the respective combined functions being different from each other.

3. The homogeneous magnetic field generating apparatus according to claim 1, wherein at least two of the group of the superconducting shim coils are wound around the cylinder member or the like disposed coaxially with the group of the main coils, and wherein the at least one of the shim coils is wound in such a manner that positions of a winding center locus of the superconducting shim coils in the axial direction change approximately in accordance with a combination of a sine or cosine function with a cycle of (360/m) degrees (m: an integer of one or more) and a sine or cosine function with a cycle of (360/(m+2)) degrees, distances of the shim coils from the center axis being different from each other.

4. The homogeneous magnetic field generating apparatus according to claim 1, wherein the at least one of the superconducting shim coils is disposed at a position sandwiched between the group of the superconducting main coils and the measuring space.

5. The homogeneous magnetic field generating apparatus according to claim 1, wherein the at least one of the superconducting shim coils generates magnetic field having plural modes.

6. The homogeneous magnetic field generating apparatus according to claim 1, wherein a value of current flowing through each of the superconducting shim coils is independently controlled to correct plural modes of magnetic field simultaneously.

7. The homogeneous magnetic field generating apparatus according to claim 1, wherein the group of superconducting main coils is constituted by a first group of superconducting main coils and a second group of superconducting main coils being separated from each other with a gap in an axial direction.

8. A nuclear magnetic resonance apparatus that uses the homogeneous magnetic field generating apparatus according to claim 1.

* * * * *